US009882564B1

(12) United States Patent
Zangi et al.

(10) Patent No.: US 9,882,564 B1
(45) Date of Patent: Jan. 30, 2018

(54) IN LINE CRITICAL PATH DELAY MEASUREMENT FOR ACCURATE TIMING INDICATION FOR A FIRST FAIL MECHANISM

(71) Applicants: Uzi Zangi, Hod-Hasharon (IL); Neil Feldman, Moeshet (IL)

(72) Inventors: Uzi Zangi, Hod-Hasharon (IL); Neil Feldman, Moeshet (IL)

(73) Assignee: PLSENSE Ltd., Yokneam (IL)

( * ) Notice: Subject to any disclaimer, the term of this patent is extended or adjusted under 35 U.S.C. 154(b) by 0 days.

(21) Appl. No.: 15/462,878

(22) Filed: Mar. 19, 2017

(51) Int. Cl.
*H03K 5/13* (2014.01)
*G01R 31/3177* (2006.01)
*H03K 19/003* (2006.01)
*H03K 19/00* (2006.01)
*H03K 5/159* (2006.01)
*G01R 31/3183* (2006.01)
*G01R 31/3185* (2006.01)
*H03K 5/156* (2006.01)
*H03K 5/135* (2006.01)

(52) U.S. Cl.
CPC ... *H03K 19/00323* (2013.01); *G01R 31/3177* (2013.01); *G01R 31/31858* (2013.01); *G01R 31/318328* (2013.01); *H03K 5/135* (2013.01); *H03K 5/156* (2013.01); *H03K 5/159* (2013.01); *H03K 19/0008* (2013.01)

(58) Field of Classification Search
CPC ........ G06F 1/10; G06F 11/27; G06F 13/1689; G06F 17/5031; G06F 1/08; G06F 2217/84; H03K 5/133; H03K 19/1733; H03K 19/17744; H03K 2005/00058; H03K 3/0315; H03K 5/135; H03K 19/173; H03K 2005/00019; H03K 5/131; H03K 5/14; H03L 7/0995; G01R 31/2882; G01R 31/31725; G01R 31/31716; G01R 31/31718; G01R 31/31858; G11C 2029/0409; G11C 2029/0411; G11C 29/023
See application file for complete search history.

(56) References Cited

U.S. PATENT DOCUMENTS

| 5,923,676 | A | * | 7/1999 | Sunter | G01R 31/31858 714/733 |
| 6,424,198 | B1 | * | 7/2002 | Wolford | G06F 1/10 327/161 |
| 6,798,186 | B2 | * | 9/2004 | Korger | G01R 31/3016 324/73.1 |
| 7,619,451 | B1 | * | 11/2009 | Hoang | G06F 1/12 327/146 |
| 7,821,312 | B1 | * | 10/2010 | Zheng | H03K 19/1733 327/145 |

(Continued)

*Primary Examiner* — Vibol Tan

(57) ABSTRACT

A method for implementing a programmable critical delay path measurement in-line with the critical path logic cells. Additionally, the delay measurement creates a code to be used with a programmable DLL which indicates the delay of the measured critical path. This code can also be used by an off line First Fail Circuit which can mimic the delay of the critical path and give an indication of the critical path delay. The target of this invention is to create a method to optimize the required operating voltage of an integrated circuit per specific speed requirement, overcoming different process variations, temperatures changes and in die variations.

8 Claims, 6 Drawing Sheets

In-line delay measurement according to one embodiment of the new invention

(56) References Cited

U.S. PATENT DOCUMENTS

| | | | | |
|---|---|---|---|---|
| 7,863,931 B1* | 1/2011 | Zhang | ............. | H03K 19/17744 |
| | | | | 326/38 |
| 8,723,577 B2* | 5/2014 | Felix | ........................ | G06F 1/10 |
| | | | | 327/291 |
| 9,222,971 B2* | 12/2015 | Wang | ............... | G01R 31/31703 |
| 9,459,314 B1* | 10/2016 | Chang | ................ | G01R 31/2882 |
| 9,602,106 B1* | 3/2017 | Bourgeault | ........ | H03K 19/1733 |
| 9,712,141 B2* | 7/2017 | Zyuban | ................... | H03K 5/04 |
| 2008/0129357 A1* | 6/2008 | Chlipala | ............... | H03L 7/0814 |
| | | | | 327/161 |
| 2008/0143383 A1* | 6/2008 | Wong | ........................ | G06F 1/10 |
| | | | | 326/46 |
| 2008/0183924 A1* | 7/2008 | Vergnes | ................... | G06F 1/10 |
| | | | | 710/100 |
| 2015/0121158 A1* | 4/2015 | Wang | .............. | G01R 31/31703 |
| | | | | 714/726 |

* cited by examiner

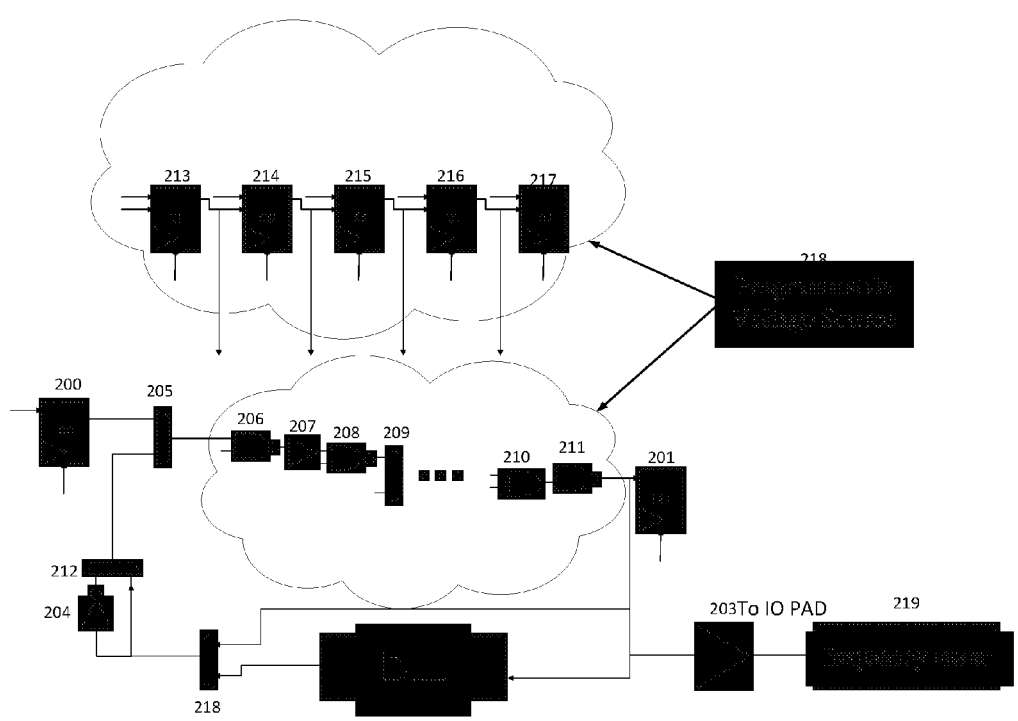
*Figure 1: In-line delay measurement according to one embodiment of the new invention*

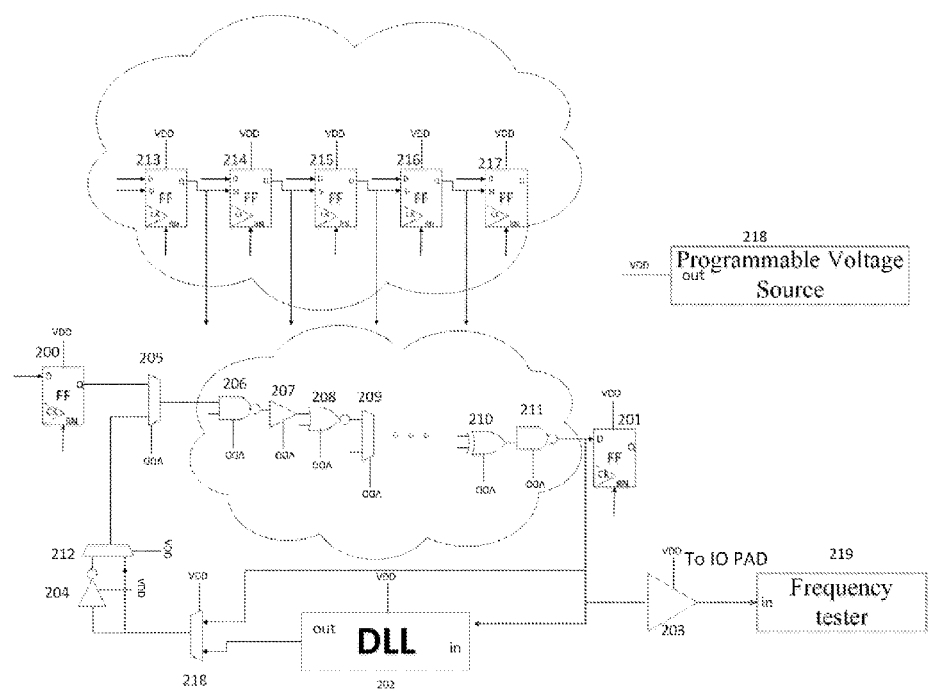
*Figure 2: In-line delay measurement according to one embodiment of the new invention*

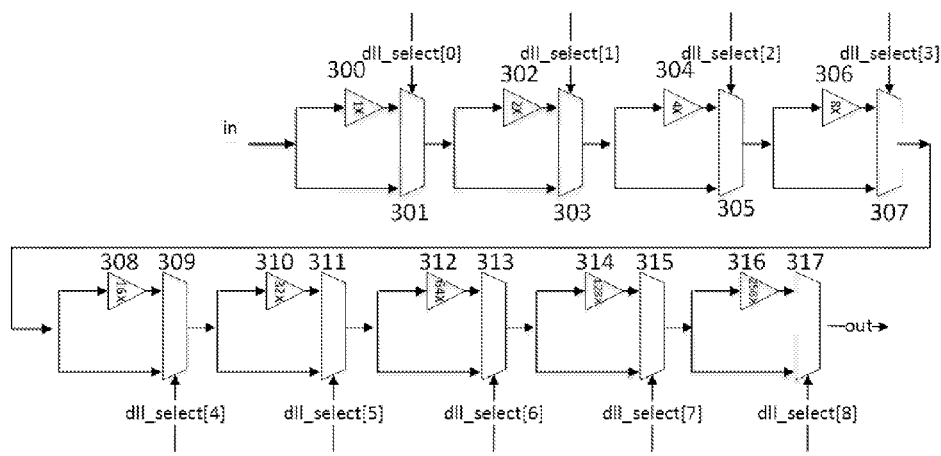
Figure 3: Programmable DLL structure according to one embodiment of the new invention

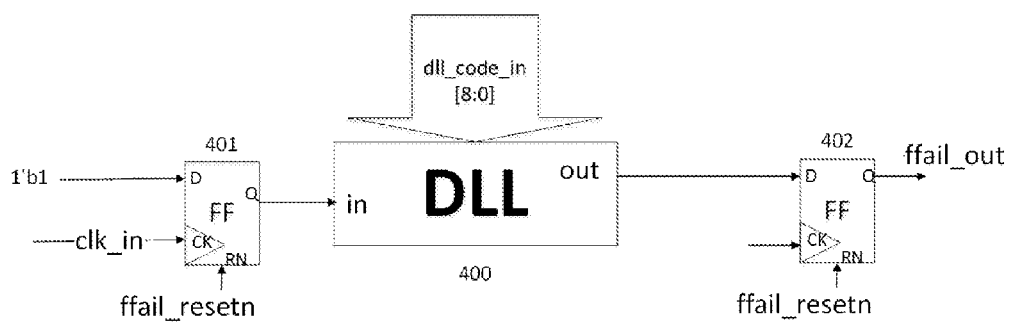
Figure 4: First Fail Circuit which mimics the delay timing of the critical path according to one embodiment of the new invention

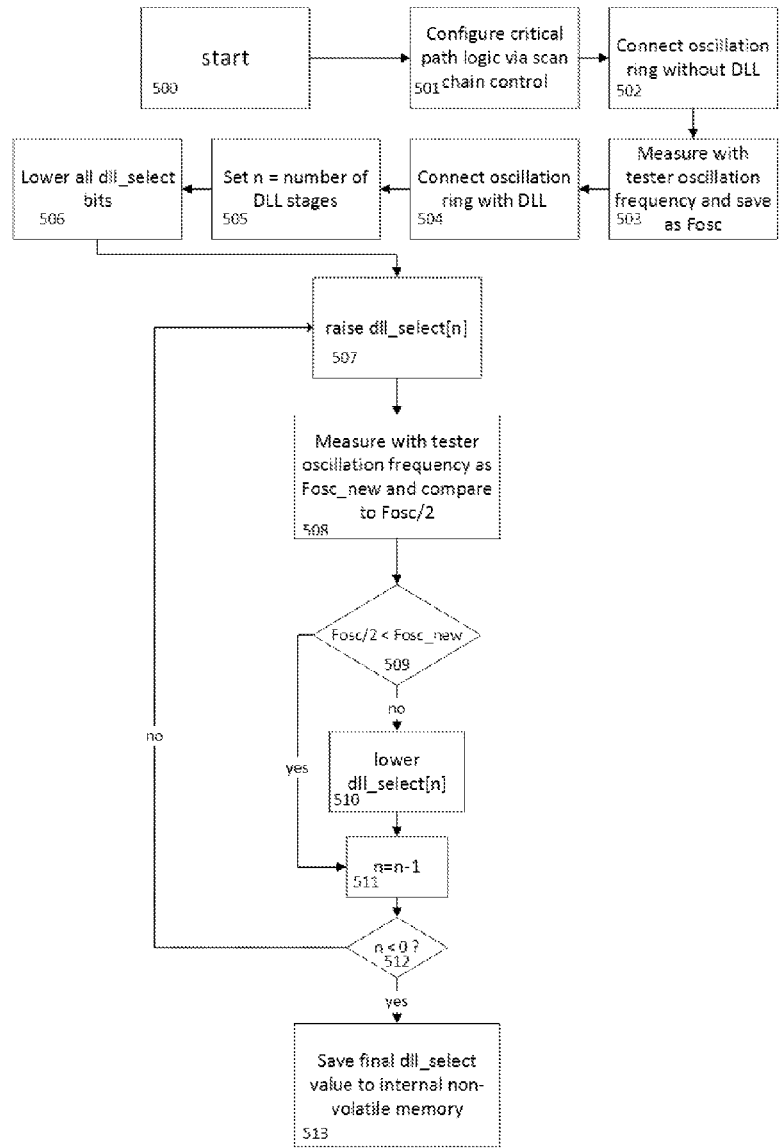
Figure 5: Flow chart for obtaining the accurate measurement and representation of the critical path delay by using the programmable DLL according to one embodiment of the new invention

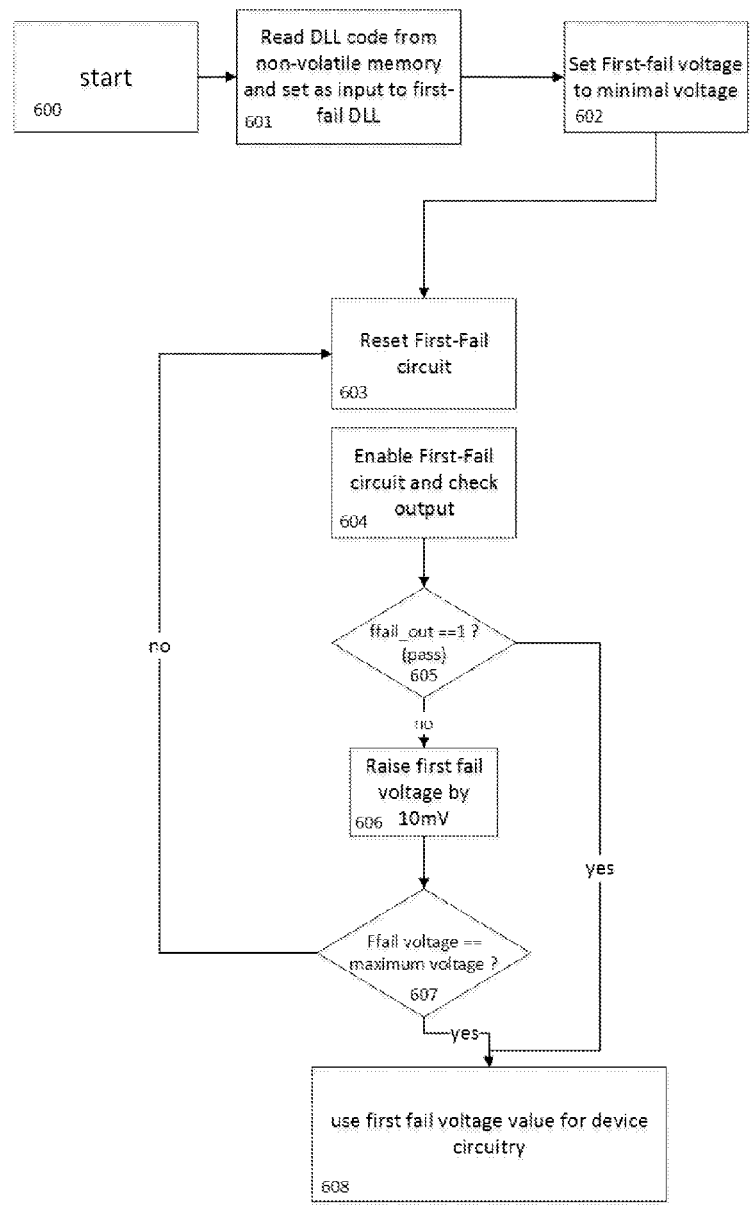
Figure 6: Flow chart for obtaining the target working voltage using the First Fail mechanism and the DLL code according to one embodiment of the new invention

IN LINE CRITICAL PATH DELAY MEASUREMENT FOR ACCURATE TIMING INDICATION FOR A FIRST FAIL MECHANISM

FIELD OF THE INVENTION

The invention relates to the development of ultra-low power integrated circuits and, more specifically, to the characterization of the critical path timing using a programmable DLL and a way to mimic this delay using a first Fail Circuit.

BACKGROUND OF THE INVENTION

Many new emerging applications require the use of ultra-low power consumption solutions inside a chip. This will allow them to be incorporated into devices that operate from a small non-chargeable battery for very long periods without the need to frequently charge the battery. For example, wearable, mobile and Medical devices which are battery operated may require an ultra-low power solution.

In parallel the scaling of the silicon manufacturing geometry doubles every 2 years creating larger and faster chips which include many more transistors and logic inside that are running at higher speed and consume more power. In addition to this, the advanced process become less controllable and the difference between the performance of the worst-case device and the best-case device can be more than 5×, so trying to design and ensure that its performance is met for the worst-case condition causes a large overhead during the design and increases area and power dramatically.

In order to enable this increase in speed and size but maintain the power at reasonable levels which can fit battery operated devices there is a need to be able to design the chip for the typical process and temperature and to optimize the operating voltage of the device based on the chip manufacturing corner, temperature and process variations. The optimization of the operating voltage will cause the chip to run with lower voltage than if it was designed for the worst-case conditions and using this method it is possible to reduce the active and leakage power by the square factor of the voltage reduction.

In order that a device which is designed for the typical case will work also at different corners of the process there is a need to measure very accurately the timing of the critical path of the design (critical path is defined as the longest electrical path between two flip-flops of the device, that is to say having the longest transmission) and mimic exactly this path to a First Fail mechanism which can be tested separately from the rest of the device. According to the test results of the First Fail mechanism it is then possible to determine the optimal operating voltage of the entire chip.

Accurate measurement of the critical path inside each device is a complicated task because this path timing can change based on the process corner, temperature and also on the location on the wafer and inside the die. To solve this problem an in-line measurement is needed per chip in order to determine the accurate path delay and to mimic this exact delay inside the First Fail circuit.

PRIOR ART

Various methods and implementations for in line delay measurements have been introduced in prior art. The main differences between the prior art and this invention are:

1. In this invention, the method that the critical path delay is measured and the First Fail programmable delay code it obtained are different.
2. This invention proposes an extra circuitry that mimics the critical path delay and is used as a separate First Fail circuitry which is tested separately from the main circuitry and does not interfere with the operation of the main circuitry.

The prior art invention of US2006/0200716A1 is using the input and output of the critical path as input and output for a pulse generator which is used to measure the path length by reducing the clock speed until the path stops working correctly. This method can give timing measurements for the critical path delay but can't help to mimic this delay on the same silicon in a First Fail circuit.

The prior art invention of FR3010759A1 is using a method that delays the clock signal of the critical path with a programmable delay line, to emulate the critical path delay, but as it is integrated within the actual design it does not allow for separate measurement without interrupting the circuits operation.

BRIEF SUMMARY OF THE INVENTION

FIG. 1 shows an example of a critical timing path were a critical path is defined as the longest electrical path between two Flip-Flops (100 and 101 in FIG. 1) of the device. Between these Flip-Flops there are plurality of combinational cells which form the designed logic function (cells 102 through 107 in FIG. 1).

For one embodiment of the invention, the target is to measure within the operational circuitry (in-line) the accurate timing delay of the logic path between the 2 Flip-Flops (100 and 101 in FIG. 1). For this purpose, as shown at FIG. 2 an in-line programmable DLL circuit (202 in FIG. 2) is implemented and connected to the input and output of the critical path logic.

An additional embodiment of the invention proposes to use scan chain control of the critical path logic using Flip-Flops 213 through 217 in FIG. 2 as an example to create an oscillation path through the critical path (cells 206 through 211 in FIG. 2), optionally through a DLL (cell 202 in FIG. 2) and through 3 multiplexers (cells 218, 212, 205 in FIG. 2). To ensure an odd number of inversions in the oscillation path an extra inverter can be added (cell 204 in FIG. 2) by controlling multiplexer 212 in FIG. 2.

An additional embodiment of the invention proposes to measure the above oscillation path with two options: including and excluding the DLL. The frequency of this oscillation can be measured on a production tester via an output pad of the chip driven by a buffer (cell 203 in FIG. 2). By varying the DLL code, it is possible to reach a situation whereby the frequency measured without the DLL within the oscillation path is exactly double the frequency of the oscillation path with the DLL included. This method obtains a DLL code which can mimic exactly the critical path delay.

Additionally, embodiments of the invention also include a First Fail Circuit (400 in FIG. 4) which uses the same code to generate exactly the same timing delay as the critical path based on the in-line delay measurements described above.

Additionally, embodiments of the invention use the First Fail Circuit and a separate voltage source for this circuit to test per given frequency, process corner and temperature condition what is the optimal voltage in which this First Fail circuit still operates. Once this voltage level is obtained, this voltage can be used safely for the functional circuitry of the device because this First Fail DLL code is emulating the worst-case path of the design. By using this method, it is possible to reach an optimal voltage which will ensure the optimal power consumption of the device.

BRIEF DESCRIPTIONS OF THE DRAWINGS

The invention may be understood by referring to the following description and accompanying drawings that are used to illustrate embodiments of the invention. In the drawings:

FIG. 1 is a general description of a critical path inside the device which is the longest electrical path which is built from different logic cells between 2 Flip-Flops.

FIG. 2 is the description of the in-line critical path timing measurement using a programmable DLL according to one embodiment of this invention.

FIG. 3 is one example description of a programmable DLL according to another embodiment of this invention.

FIG. 4 is a general description of the First Fail Circuit according to another embodiment of this invention.

FIG. 5 is a flow chart which describes the mechanism of how to create from the critical path delay a DLL code that accurately mimics the critical path delay according to another embodiment of this invention.

FIG. 6 is a flow chart which describes the First Fail Circuit operation to achieve the optimal voltage per giving frequency according to another embodiment of this invention.

DETAILED DESCRIPTION OF THE INVENTION

The present invention includes a method and apparatus for accurate in-line measurement of a device critical path timing (critical path is the longest electrical path passing plurality of combinational cells between two flops of the device, that is to say having the time to the longest transmission) in order to mimic this delay into a separate programmable DLL First Fail circuit, which will be used in order to dynamically control the operating voltage of the device to get optimal power consumption.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

For one embodiment of the invention, a critical path inside the device is selected which represents the worst-case timing path of the device. An example of a critical path is shown at FIG. 1 where the input to the critical path starts at Flip-Flop 100 in FIG. 1 and the path is propagated through plurality of different combinational cells (102 through 107 in FIG. 1) and then sampled by the output Flip-Flop (101 in FIG. 1).

For another embodiment of the invention, a programmable DLL (cell 202 in FIG. 2) is connected to the output and input of the plurality of the combinational cells in a way which creates an oscillation loop as seen on FIG. 2. The output of the oscillation loop is driven to the devices PAD to be sampled by an external frequency measurement tool or Tester (through buffer 203 in FIG. 2).

For another embodiment of the invention, the critical path combinational cells (206 through 211 in FIG. 2) can be controlled through existing Flip-Flops in the device (213 through 217 in FIG. 2) using a scan chain which drives a valid data into each Flip-Flop in order to control the logic of the critical path to ensure that the logic of the selected critical path enables the signal propagation.

For another embodiment of the invention, three multiplexers (205, 212 and 218 at FIG. 2) are added within the oscillation path. The first multiplexer is to bypass the programmable DLL cell 218 in FIG. 2). The second multiplexer is to close the oscillation loop (cell 205 in FIG. 2). The third multiplexer (cell 212 in FIG. 2) is used to add an additional inversion stage if needed to ensure oscillation. By using these three multiplexers with different settings it is possible to create an oscillation loop only through the critical path logic or through the critical path logic and the programmable DLL.

For another embodiment of the invention, a method is proposed to obtain an accurate measurement and representation of the critical path delay by using the programmable DLL and the critical path delay oscillation loop described above (in FIG. 2). The flow chart of how to obtain this code is described in FIG. 5, The first stage is to configure the critical path using the scan chain control (box 501 in FIG. 5). The second stage of this method is to set the multiplexer controls so that only the plurality of the critical path combinational cells are closed in an oscillation loop (box 502 in FIG. 5) and the frequency is measured off-chip by the tester (box 503 in FIG. 5). The third stage of this method is to set the multiplexer controls so that the programmable DLL is also connected within the oscillation loop (box 504 in FIG. 5) while all DLL control bits are zero (box 506 in FIG. 5) and the frequency is again measured by the tester (box 508 in FIG. 5). The Fourth stage of this method is to modify the programmable DLL code in a binary search algorithm as described in the flow chart of FIG. 5 (box 507-512 in FIG. 5) until the output frequency equals half the frequency which was measured in the second stage (via the combination cells only). The fifth stage of this method is to record the DLL code within a memory element within the device (box 513 in FIG. 5).

For another embodiment of the invention, a programmable DLL is presented (described in FIG. 3) which includes different delay cells (300, 302, 304, 306, 308, 310, 312, 314 and 316 in FIG. 3). The DLL has an exponent-by-2 increasing delay between each stage and a multiplexer in each stage (301, 303, 305, 307, 309, 311, 313, 315 and 317 in FIG. 3) which can select between the path with the delay cells or the path without them. Using the control lines (dll_select[8] through dll_select[0]) which control the multiplexers it is possible to obtain a different delay from this DLL which can then be adjusted to equal the critical path delay measurement as described above.

For another embodiment of the invention, a First Fail Circuit (shown in FIG. 4) is built in order to mimic the exact delay which exists in the critical path delay. This First Fail Circuit is built from the same programmable DLL (400 in FIG. 4) which is used in-line with the critical path (202 in FIG. 2) to measure it's timing delay. The same DLL control code which was generated using the in-line DLL and the critical path oscillation loop is used also for the First Fail programmable DLL. 2 Flip-Flops are used within the First Fail Circuit. The first Flip-flop drives the input to the programmable DLL (401 in FIG. 4) and has an input which is always connected to logic-1 and the second Flip-Flop (402 in FIG. 4) which is connected to the output of the programmable DLL. Both Flip-Flops can be reset before the test is performed and then exactly two clock cycles are given to the 2 Flip-Flops, after these 2 clock cycles the output of the second Flip-Flop (402 in FIG. 4) is sampled by the CPU. If the result equals logic-1 then the DLL delay is too short and if the result equals logic-0 the DLL delay is too long.

For another embodiment of the invention, a First Fail mechanism can be used in order to determine the optimal voltage which can be used by the device logic per a given frequency. The flow chart of this procedure is described in FIG. 6. The DLL inside the First Fail logic is set to the exact code which mimics the critical path delay of the chip and was measured according to the flow chart in FIG. 5 (601 in FIG. 6) then the operating voltage of the First Fail logic, which is controlled by a separate voltage source than the rest of the device, is set to the minimal voltage (602 in FIG. 6). Per a given frequency which is given to the clock of the First Fail Flip-Flops a test can be performed to check if the DLL delay is too short or too long at a given voltage (603 to 607 in FIG. 6). By using this method, the voltage can be increased until a pass result is obtained by the First Fail circuit (605 in FIG. 6). A pass condition indicates that the first fail delay is exactly within the given clock period. Once this condition is met the test can be stopped and the last passing voltage can be used by the rest of the device as the operating voltage (608 in FIG. 6). As the First Fail circuit has an equal path delay as the worst case critical path within the device we ensure that the device will functional correctly given the same voltage of operation which is used also by the First Fail Circuit.

Advantages of the Invented Embodiments

In the current invention, the measurement of the critical path delay is done in-line to the critical path logic and an accurate representation of this path is done using a programmable DLL which is connected to the critical path logic. In prior art, the measurements of the critical path delay are done either external from the critical path logic or are not represented using a programmable DLL.

In the current invention, an accurate First Fail circuit is used to determine the optimal operating voltage per device for a required frequency and environment conditions such as the chip silicon corner or temperature. This First Fail Circuit uses the exact programmable DLL which was used in order to represent the accurate delay of the critical path and by using this First Fail Circuit we can mimic exactly the delay of the critical path and with this emulation get an accurate optimal operating voltage. In prior art, there is no accurate use of First Fail Circuit which mimics the exact critical path delay as done in this invention.

What we claim is:

1. An integrated circuit, compromising:
a first Flip Flop and a second Flip Flop;
a plurality of multiplexers;
a critical path delay built from plurality of combinational cells located between the first Flip Flop and a second Flip Flop, wherein a transition of an output signal of the first Flip Flop to a delay path cause a transition to an input of the second Flip Flop;
an in-line programmable Delay Line (DLL) connected to the output and input signals of the integrated circuit critical path, wherein an oscillation loop is created in two different options—with said DLL and without said DLL using different multiplexers of the plurality of multiplexers in the circuit;
a First Fail circuit built from a programmable Delay Line (DLL) having similar properties to the programmable Delay Line used inside the critical path configured to mimic an exact delay of the critical path in the integrated circuit;
wherein the First Fail circuit is in a configuration that gives a pass/fail indication;
a separate programmable voltage source connected to the First Fail circuit;
wherein the First Fail circuit is connected to a single voltage source different from the one used by the integrated circuit and receives an identical clock as the integrated circuit is using.

2. The integrated circuit from claim 1, wherein the DLL is comprising from multiple stages and each stage is selected to either use a delay cell or to bypass this delay.

3. The integrated circuit from claim 1, wherein the critical path is connected in a closed loop configuration wherein the output level is inverted from the input level create a toggling signal which frequency is measured by an external frequency tester.

4. The integrated circuit from claim 1, wherein the critical path is connected through the DLL in a closed loop configuration wherein the output level is inverted from the input level to create a toggling signal which frequency is measured by an external frequency tester.

5. The integrated circuit from claim 1, wherein a frequency which is measured using the oscillation loop configured to include the critical path plurality of cells and the said DLL, is configured, by changing the DLL code, to be half of the frequency of the oscillation loop that includes the critical path delay only, and therefore the DLL total delay is equal to the critical path delay using the selected code which represents the critical path delay.

6. The integrated circuit from claim 1, wherein the First Fail circuit which includes an exact copy of the same programmable DLL as the one utilized as an in-line programmable Delay Line (DLL), is used to mimic the exact delay of the critical path using identical code which was obtained during the critical path delay measurement using the in-line DLL.

7. The integrated circuit from claim 1, wherein a pass result at the First Fail circuit indicates that the given DLL delay is shorter than a used clock cycle and a fail result at the First Fail circuit indicates that the given DLL delay is longer than the used clock cycle.

8. The integrated circuit from claim 1, wherein a minimum voltage at which the First Fail circuit outputs a pass result indicates a lowest possible voltage level to be used on the integrated circuit to optimize a integrated circuit power consumption.

* * * * *